United States Patent [19]

Little

[11] Patent Number: 4,890,263

[45] Date of Patent: Dec. 26, 1989

[54] RAM WITH CAPABILITY FOR RAPID CLEARING OF DATA FROM MEMORY BY SIMULTANEOUSLY SELECTING ALL ROW LINES

[75] Inventor: Wendell L. Little, Carrollton, Tex.

[73] Assignee: Dallas Semiconductor Corporation, Dallas, Tex.

[21] Appl. No.: 200,649

[22] Filed: May 31, 1988

[51] Int. Cl.⁴ .................... G11C 7/00; G11C 11/40
[52] U.S. Cl. .................................. 365/218; 365/22; 365/226
[58] Field of Search ............ 365/218, 226, 277, 189.11

[56] References Cited

U.S. PATENT DOCUMENTS

| | | | |
|---|---|---|---|
| 4,575,823 | 3/1986 | Fitzpatrick | 365/218 |
| 4,587,629 | 5/1986 | Dill et al. | 365/218 |

FOREIGN PATENT DOCUMENTS

| | | | |
|---|---|---|---|
| 57-176587 | 10/1982 | Japan | 365/218 |
| 60-79597 | 7/1985 | Japan | 365/218 |
| 60-182097 | 9/1985 | Japan | 365/218 |
| 61-105793 | 5/1986 | Japan | 365/218 |
| 62-295296 | 12/1987 | Japan | 365/218 |
| WO82/2022-74 | 7/1982 | PCT Int'l Appl. | 365/218 |

*Primary Examiner*—Stuart N. Hecker
*Assistant Examiner*—Alfonso Garcia
*Attorney, Agent, or Firm*—Worsham, Forsythe, Sampels & Wooldridge

[57] ABSTRACT

A Random Access Memory having a fast Clear operation includes a cell array (10) which has a plurality of memory cells arranged in rows and columns. Each of the rows is selected by word lines (12) and the data is output on column lines (14). Each of the word lines (12) is selected by a row decode circuit (20) or a Clear signal through OR gates (22). The Clear signal selects all of the word lines (12) such that each row in the cell array (10) is selected. The bit line associated with each column are pulled to ground through an N-channel transistor (36) and a bit line bar pulled high through a P-channel transistor (38). In addition, the $V_{CC}$ supply to the array (10) is decoupled from the memory cells by a P-channel transistor (40).

7 Claims, 2 Drawing Sheets

RAM WITH CAPABILITY FOR RAPID CLEARING OF DATA FROM MEMORY BY SIMULTANEOUSLY SELECTING ALL ROW LINES

TECHNICAL FIELD OF THE INVENTION

The present invention pertains in general to a Random Access Memory, and more particularly, to clearing of the entire contents of the memory with a very short duration pulse.

BACKGROUND OF THE INVENTION

Random Access Memories are well known in the art and are utilized in applications where a user desires to both Read and Write to the memory. However, in some applications, it is important that the memory be resettable to a predetermined state wherein the logic state of all of the memory cells in the memory is the same. One such application requiring this clearing function is a cache memory. In this type of memory, it is important to have the address tag set to all zeroes upon power up of the system. Typically, this resetting of all memory cells is referred to as "flash clearing" the memory.

Another area requiring clearing of a memory is where security is involved. In these security applications, intermediate memories sometimes are provided in the form of small arrays or a group of registers for storing intermediate data which is protected from outside probing. If for some reason, this portion of the memory were invaded, it would be desirable to have a system whereby the entire contents of the memory could be cleared. However, in such applications, it is important that the memory be cleared in a very short duration of time. This may present a problem since a large number of cells must have the logic states thereof changed from one logic state to the other in this short duration of time. In the worst condition, a large number of the cells will be at the opposite logic state to that of the clear state. This would require a system that can overcome the charge stored by a large number of logic states at one time.

In prior art systems, clearing of the memory cells in an array has been accomplished by sequentially addressing each row of memory cells and then writing a zero thereto. However, this requires an additional onboard counter and a significant amount of time. This would be disadvantageous for a system wherein the memory would necessarily have to be cleared in a very short duration of time, such as security applications described above. There therefore exists a need for a memory array having the ability to be cleared to a predetermined logic state within a very short duration of time.

SUMMARY OF THE INVENTION

The present invention disclosed and claimed herein comprises a static memory array with presettable logic states. The memory array includes a plurality of static memory cells arranged in rows and columns, each of the memory cells having true and complementary sense nodes for storing the true and complement, respectively, of a binary logic state. Each of the memory cells is accessed from a row line for output of the stored logic state onto respective true and complement bit lines associated with each column of memory cells. When a clear signal is received, at least one of the true and complement bit lines in each of the memory cells is disposed at a predetermined logic state. The true and complementary sense nodes in each of the memory cells are isolated from each other during the presence of the clear signal.

In another aspect of the present invention, each of the memory cells is comprised of a six-transistor static memory cell. Each of memory cells is connected to a common dc power line which is operable to provide power thereto from the dc supply source. A dc isolation is realized by decoupling the dc power line from the dc supply during the presence of the external clear signal. During the presence of the clear signal, the other of the bit lines is pulled to the complement of the predetermined logic state. The clear signal is only present for a short duration of time.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
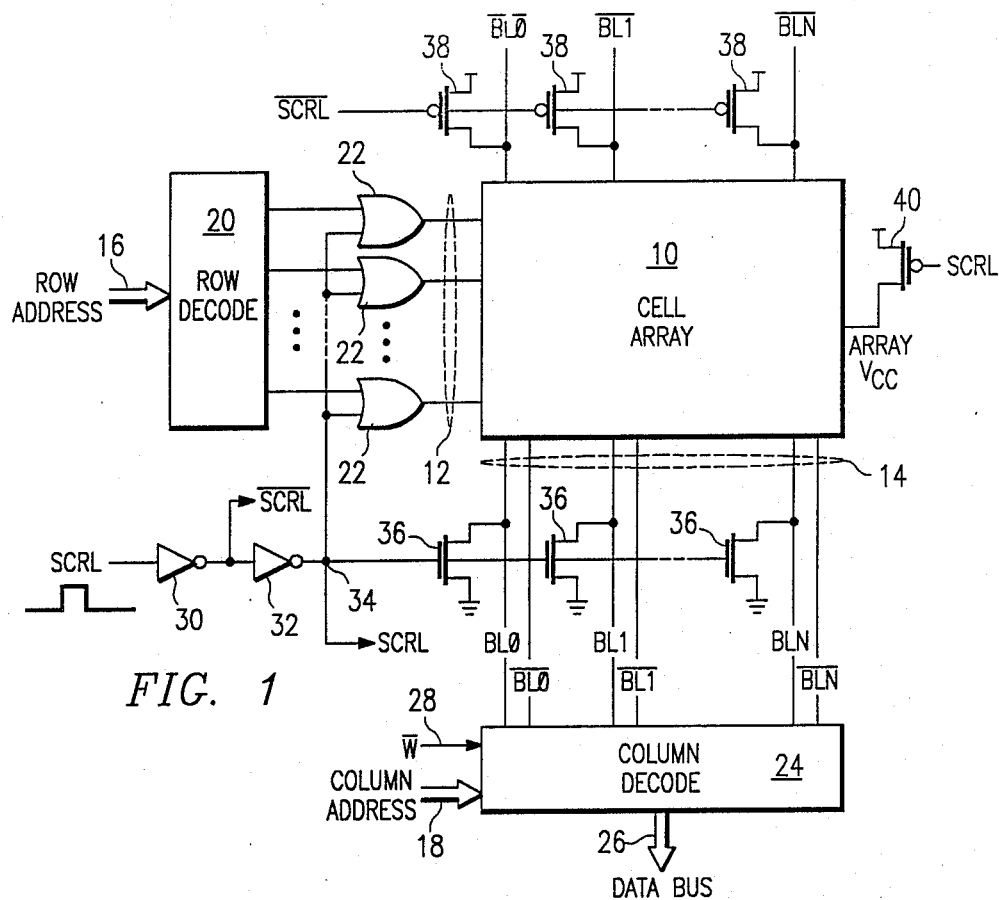
FIG. 1 illustrates a block diagram of a memory array utilizing the present invention.

Referring now to FIG. 1, there is illustrated a block diagram of a Random Access Memory utilizing the present invention. The Random Access Memory is generally comprised of a cell array 10 having a plurality of memory cells arranged in rows and columns. The memory cells are addressable by selecting one row through a group of word lines 12 with the data then being output on bit lines 14. Therefore, by activating one of word lines 12, the data stored in each of the memory cells associated therewith in the array 10 is output to the associated bit lines 14.

The memory cells are selected with a row address received on address bus 16 and a column address on a column address bus 18. The row address bus 16 is input to a row decode circuit 20 which is operable to select one of a plurality of outputs on a mutually exclusive basis. Therefore, only one word line 12 can be activated at any given time. Each of the outputs of the row decode circuit 20 are input to one input of a two input OR gate 22. The other input thereof is connected to an SCRL signal. The output of the OR gates 22 comprise the word lines 12.

The column address bus 18 is input to a column decode circuit 24, which is operable to select addressed ones of the bit lines 14 for output to a data bus 26. The selection scheme of the column decode circuit 24 depends upon the type of Random Access Memory utilized. For example, if the memory were a "by-1" memory, each column address would be associated with only one bit line. If the memory were a "by-N" memory, N bit lines would be selected wherein the data bus 26 is N-bits wide.

The memory of FIG. 1 has a normal operating mode and a clear mode. In the normal operating mode, only one row of memory cells is addressed and these memory cells are either written to or read from. This is determined by the status of a Write input signal on a line 28. However, in the Clear mode, all of the memory cells are cleared to a predetermined state, which, in the preferred embodiment, is a logic "0". The Clear signal SCRL is input to an inverter 30, the output of which provides the SCRL-bar signal. The SCRL-bar signal is then input to inverter 32, the output of which provides the SCRL signal on a node 34. The SCRL signal is a short duration pulse which is generated for only five microseconds in the preferred embodiment. This pulse is generated in response to external circuitry determining, for example, that there is a violation of the memory. In the preferred embodiment, the Clear operation is used in a security environment. In this environment, tampering with the memory or a non-secure mode that is entered results in generation of the U I pulse. It is a requirement of this security feature that the memory be cleared to a logic "0" within five microseconds.

In order to insure clearing of the memory, all of the memory cells are selected by activating all word lines 12 at the outputs of OR gates 22. A logic "0" is then input to the memory cells in the array 10 through the bit lines 14. Since each of the bit lines is comprised of the complement and the true form of the bit line, each of the true bit lines BL are connected to ground through a N-channel transistor 36 having the drain thereof connected to the associated bit line and the source thereof connected to ground. The gates of all of the N-channel transistors 36 are connected to the node 34, i.e. the U I signal. In a similar manner, the complement of the bit line BL-bar is connected to the positive supply $V_{CC}$ through a P-channel transistor 38. Each of the P-channel transistors 38 has the source thereof connected to $V_{CC}$, the drain thereof connected to the associated bit line BL-bar and the gates thereof all connected to the U I-bar input. Further, the $V_{CC}$ supply for each of the memory cells in the array is also disconnected during the presence of the clear signal SCRL by interrupting the power supply voltage thereto. To facilitate this, the $V_{CC}$ supply to each of the rows of memory cells is connected through a P-channel transistor 40 to the power supply voltage $V_{CC}$. Only one transistor 40 is shown. However, as will be described hereinbelow, there are a plurality of P-channel transistors 40 with two transistors associated with each row of memory cells. Each of the transistors 40 has the source thereof connected to $V_{CC}$, the drain thereof connected to the power supply line for the associated row and the gate thereof connected to the SCRL input. When SCRL goes high, the supply is interrupted.

Figure 2:
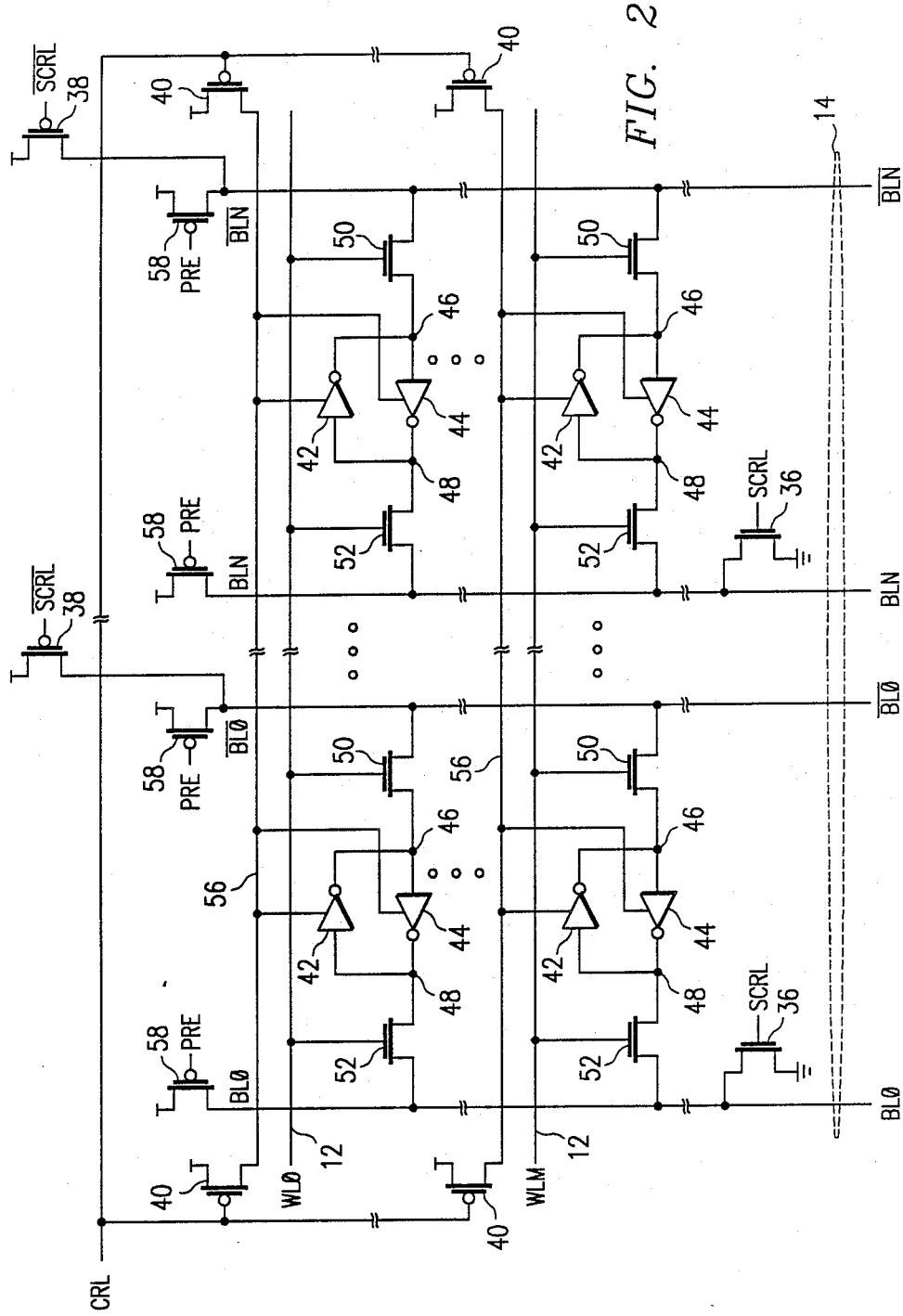
FIG. 2 illustrates a logic diagram of a number of cells in the array.

Referring now to FIG. 2, there is illustrated a logic diagram of a plurality of associated cells including two rows and two columns of memory cells, the row designated by the bit lines BL0 and BL0-bar and BLN and BLN-bar, and the rows designated by the word lines WL0 and WLM, there being zero to N columns and zero to M rows of memory cells in the array 10. Each of the memory cells is comprised of two inverters 42 and 44 arranged in a back-to-back configuration, with the output of inverter 42 connected to a sense node 46 and also to the input of inverter 44; the output of inverter 44 is connected to both a sense node 48 and the input of inverter 42. Sense node 46 is connected to the BL0-bar line through the source-to-drain path of an N-channel transistor 50, the gate of which is connected to the WL0 word line 12. In a similar manner, the sense node 48 is connected through the source-to-drain path of an N-channel transistor 52 to the BL0 bit line, the gate of transistor 52 being connected to the WL0 word line 12.

Each of the inverters 44 and 46 for each the memory cells in the array 10 have the dc inputs thereof connected to one of a plurality of lines 56, the lines 56 associated with each word line 12 in each associated row. The lines 56 in the topical layout of the cell array 10 run parallel to the row lines and comprise an active conductive run. This is to be compared with a metal run in that the active conductive run has a higher sheet resistance associated therewith. On one side of the array, the line 56 is connected to the drain of one of the P-channel transistors 40, and on the other side of the array the line 56 is also connected to the drain of another one of the P-channel transistors 40. The P-channel transistors 40 are operable to connect the line 56 to the supply voltage $V_{CC}$ in the absence (logic "0" level) of the SCRL signal.

Each of the bit lines BL0-BLN are connected to ground through an N-channel transistor 36 as described above. N-channel transistor 36 is operable to force one side of the memory cell to ground in the presence (logic "1" level) of the SCRL signal. In a similar manner, the output of the bit lines BL0-bar through BLN-bar are connected to the power supply through the P-channel transistor 38. In addition, each of the bit lines BL0 and BL0-bar through BLN and BLN-bar are also connected to one side of the source-to-drain path of a P-channel transistor 58, the other side of the source-to-drain path of transistor 58 connected to the power supply. The gates of P-channel transistors 58 are connected to a precharge signal. Transistors 58 are operable in the normal mode to precharge the bit lines prior to a Write or Read operation. The operation of the SCRL signal is such that the SCRL signal disables the precharge operation, which is accomplished by forcing PRE to a logic high, thus disabling P-channel transistors 58.

Figure 3:
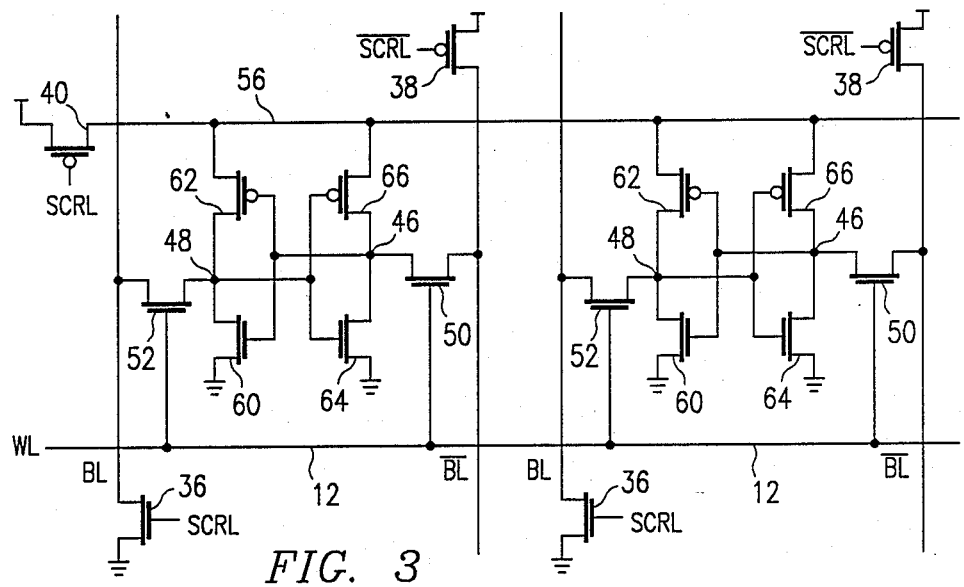
FIG. 3 illustrates a schematic diagram of two parallel cells in a given row of the memory array. It will be appreciated that for purposes of clarity and where deemed appropriate, reference numerals have been repeated in the figures to indicate corresponding features.

Referring now to FIG. 3, there is illustrated a schematic diagram of two adjacent cells in a single row in the array 10. Only the circuit associated with the Clear operation is illustrated. The inverter 44 is comprised of a CMOS pair of transistors with an N-channel transistor 60 and a P-channel transistor 62. The N-channel transistor 60 has the drain thereof connected to the sense node 48 and the source thereof connected to ground. P-channel transistor 62 has the drain thereof connected to sense node 48 and the source thereof connected to the power supply line 56. The gates of both transistors 60 and 62 are connected to the sense node 46. In a similar manner, the inverter 42 is comprised of a CMOS pair of transistors with an N-channel transistor 64 and a P-channel transistor 66. N-channel transistor 64 has the drain thereof connected to sense node 46 and the source thereof connected to ground. The P-channel transistor has the source thereof connected to the power supply line 56 and the drain thereof connected to sense node 46. Both transistors 64 and 66 have the gates thereof connected to sense nodes 48.

In operation of the Memory Clear mode, generation of U I activates all memory cells in the memory array 10. The N-channel transistors 36 conduct and pull-down the associated bit line. It should be understood that each of the bit lines has a predetermined capacitance associated therewith and, therefore, the transistor 36 must perform two operations. First, it must be able to discharge the capacitance in the associated bit line and it must also be able to override a logic "1" stored on node 48 in each of the memory cells. For a single memory cell, this would only require a transistor 36 of a size sufficient to draw more current from node 48 than supplied thereto by transistor 62 when a logic "1" is stored on node 48. However, when a given column of memory cells has a plurality of ones associated therewith, each of the cells having a logic "1" stored therein will have the associated P-channel transistor 62 turned on supplying current to the associated sense node 48. In this case, the transistor 36 must overcome the current supplied by each of the P-channel transistors 62 associated with a memory cell having a logic "1" stored therein. The worst case condition of this, of course, is when all memory cells in a given column have a logic "1" stored therein. To exacerbate this situation, the bit line has a distributed series impedance associated therewith such that some problem may occur with respect to the memory cell disposed the farthest therefrom.

To assist in clearing each of the memory cells, the transistor 38 is operable to provide current to the complement bit line BL-bar during the Clear operation such that memory cells having a logic "1" stored therein will have current provided to the sense node 46. Of course, if half of the memory cells have a logic "1" stored therein and half have a logic "0", the ones with the logic "0" will provide current from sense node 36 through the bit line-bar to sense node 46 of the transistors having a logic "1" stored therein. However, the transistor 38 provides additional current to pull sense node 46 to a logic high, thus turning on transistor 60 and assisting transistor 38 in pulling the sense node 48 down. Transistor 60 therefore provides an additional current path to override the associated transistor 62.

In order to further decrease the effect of the P-channel transistor 62 in a condition where a logic "1" is stored in the memory cell, the power supply to each of the rows is disconnected from $V_{CC}$ by transistors 40 during a Clear operation. Of course, there is still one additional path of coupling to the node 48. This is when the adjacent cells in a row have a logic "0" stored therein. In this mode, the transistor 38 associated with the cells having a logic "0" stored therein provides current to node 46, which current is then coupled to the power line through the P-channel transistor 66. This current can then flow from line 56 to node 48. However, this effect is minimized by the series resistance of line 56 (which, as described above, is an active run of conductive material), which decreases the effect of this source of current. This situation would result in transistor 62 being placed in series with the series resistance of the line 56 and the series resistance of all of P-channel 66 in the associated cells having a logic "0" stored therein. In addition, the transistor 38 and transistor 50 of the logic "0" cell are also in series.

In summary, there has been provided a Random Access Memory with a fast Clear operation wherein all of the memory cells are cleared to a logic "0". During clearing of the memory cells, each of the word lines is activated and then one side of the memory cell is pulled to a logic "0" and one side of the memory cell is pulled to a logic "1". Further, the power supply line to each of the memory cells is disconnected such that cells at a logic "1" state do not override the clearing operation.

Although the preferred embodiment has been described in detail, it should be understood that various changes, substitutions and alterations can be made therein without departing from the spirit and scope of the invention as defined by the appended claims.

What is claimed is:

1. A static memory array with presettable logic states, comprising:

an array of static memory cells arranged in rows and columns, each of said memory cells having true and complement sense nodes for storing the true and complement, respectively, of a binary logic state, and comprising a first inverter having the input thereof connected to said true sense node and the output thereof connected to said complement sense node, and a second inverter having the input thereof connected to said complement sense node and the output thereof connected to said true sense node;

a plurality of row lines each connected to respective ones of said memory cells in an associated row for activating said associated memory cells;

a plurality of pairs of true and complement bit lines each connected to the true and complement sense nodes, respectively, of respective ones of said memory cells in a respective column, activation of each of said row lines activating the associated one of said memory cells for output of the true and complement logic state to said true and complement bit lines, respectively, means for activating all of said row lines in response to receiving an external clear signal;

means for forcing said true and complement bit lines associated with each of said memory cells to predetermined mutually complementary logic states during the presence of said clear signal; and means for disconnecting each of said first and second inverters from said DC supply during the presence of said clear signal.

2. The memory array of claim 1, wherein each of said memory cells comprises:

a first inverter having the input thereof connected to said true sense node and the output thereof connected to said complement sense node;

a second inverter having the input thereof connected to said complement sense node and the output thereof connected to said true sense node;

a first gate for connecting said true sense node to said true bit line; and a second gate for connecting said complementary sense node to said associated complementary bit line;

said first and second gates operating in response to activation of said associated one of said row lines;

each of said first and second inverters having:
a P-channel transistor having the source-to-drain path thereof connected between a DC supply and the associated output thereof, and
an N-channel transistor having the source-to-drain path thereof connected between said associated output and a reference voltage,
the gates of said P-channel and N-channel transistors connected together to provide the input thereof;

and further comprising means for disconnecting each of said first and second inverters from said DC supply during the presence of said clear signal.

3. A static memory array with presettable logic states, comprising:

an array of static memory cells arranged in rows and columns, each of said memory cells having true and complement sense nodes for storing true and complement forms, respectively, of a binary logic state;

a plurality of row lines each associated with one of said rows of memory cells and operable to access said memory cells in the associated row when said associated row line is activated;

a plurality of pairs of true and complement bit lines, each said pair of bit lines being associated with one of said columns of memory cells, activation of said row lines accessing the associated one of said memory cells for output of the true and complement forms of said stored logic states to said true and complementary bit lines, respectively;

means for activating all of said row lines in response to receiving an external clear signal for a short duration of time;

means for forcing at least one of said true and complementary bit lines to a predetermined logic state in each of said columns of memory cells during the presence of said clear signal;

at least one DC power line for providing DC power from a DC power supply to each of said memory cells in said array;

each of said memory cells having first and second inverters configured in the back-to-back configuration and having a DC input connected to said DC power line, each of said memory cells having a first gate for connecting said complement sense node to said complement bit line and a second gate for connecting said true sense node to the associated true bit line; and power supply gate circuitry for decoupling said DC power line from said DC power supply during the presence of said clear signal.

4. The memory array of claim 3, wherein each respective one of said inverters comprises:

a P-channel transistor having the source-to-drain path thereof connected between said DC power line and the respective output thereof; and an N-channel transistor having the source-to-drain path thereof connected between the output thereof and a reference voltage;

the gates of said P-channel and N-channel transistors being connected together to provide the input of said inverter.

5. The memory array of claim 3, wherein said DC power supply line comprises a plurality of DC supply lines, each associated with one row of said memory cells to provide power thereto.

6. The memory array of claim 3, further comprising:

a row decoder for receiving an external row address and activating one of a plurality of decoded outputs, each of said decoded outputs being associated with one of said row lines and selected on a mutually exclusive basis;

said means for activating comprising a plurality of logic OR circuits, each of said logic OR circuits associated with each of said row lines and having the output thereof connected to said associated row line, each of said logic OR circuits having two inputs, one input connected to a respective one of the decoded outputs of said row decoder and a second input thereof connected to said external clear signal, the output of said logic OR circuits activating all of said row lines in response to the presence of said clear signal.

7. A method for clearing a plurality of static memory cells to a predetermined logic state wherein each of the memory cells has a true and complement sense node for storing the true and complement, respectively, of the binary logic state, comprising:

providing memory cells arranged in an array of rows and columns; providing a separate row line for each of the rows of memory cells for selective activation thereof; and providing a true and a complement bit line for each column of the memory cells for receiving the true and complement outputs thereof, respectively, when accessed;

activating all of the row lines in response to receiving an external clear signal;

disposing said true and complement bit lines in each of the columns of memory cells at predetermined mutually complementary logic states in response to the receipt of the external clear signal;

providing a DC power line for providing DC power to each of the memory cells from a DC power supply source; and decoupling the DC power line from the DC power supply during the presence of the external clear signal.

* * * * *